United States Patent
Wu

(10) Patent No.: US 8,717,096 B2
(45) Date of Patent: May 6, 2014

(54) SWITCHING AMPLIFIER SYSTEM AND METHOD FOR SUPPRESSING SIGNAL DISTORTION THEREOF

(75) Inventor: Li-Te Wu, Hsinchu County (TW)

(73) Assignee: NeoEnergy Microelectronics, Inc., Chupei, Hsinchu County (TW)

( * ) Notice: Subject to any disclaimer, the term of this patent is extended or adjusted under 35 U.S.C. 154(b) by 53 days.

(21) Appl. No.: 13/488,834

(22) Filed: Jun. 5, 2012

(65) Prior Publication Data

US 2013/0214856 A1  Aug. 22, 2013

Related U.S. Application Data

(60) Provisional application No. 61/600,173, filed on Feb. 17, 2012.

(51) Int. Cl.
*H03F 3/38* (2006.01)

(52) U.S. Cl.
USPC .......................................................... 330/10

(58) Field of Classification Search
USPC ............................... 330/10; 332/109; 375/238
See application file for complete search history.

(56) References Cited

U.S. PATENT DOCUMENTS

| | | | |
|---|---|---|---|
| 5,617,058 A * | 4/1997 | Adrian et al. | 330/10 |
| 7,956,681 B2 * | 6/2011 | Guilherme et al. | 330/10 |

* cited by examiner

*Primary Examiner* — Steven J Mottola
(74) *Attorney, Agent, or Firm* — Muncy, Geissler, Olds & Lowe, P.C.

(57) ABSTRACT

The invention further provides a switching amplifier system. In one embodiment, the switching amplifier system comprises a noise shaper, a corrector, and a pulse width logic. The noise shaper receives a first signal, performs a noise shaping process to process the first signal according to a feedback signal to generate a second signal sliced into a plurality of frames. The corrector adds a plurality of correction pulses respectively to the frames of the second signal to obtain a third signal in such a way that the correction pulse added to the second signal in a target frame selected from the frames has a polarity inverse to that of an original waveform of the second signal in the target frame. The pulse width logic then converts the third signal to a pulse width modulation (PWM) signal.

12 Claims, 19 Drawing Sheets

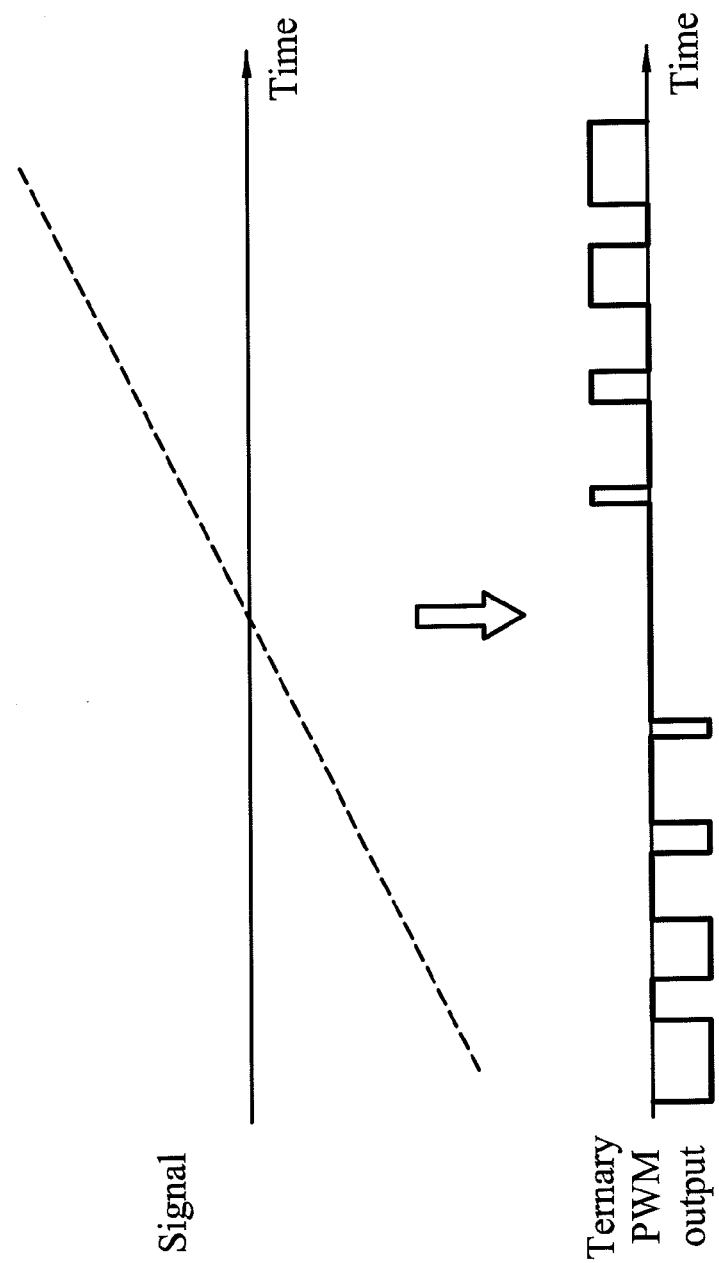

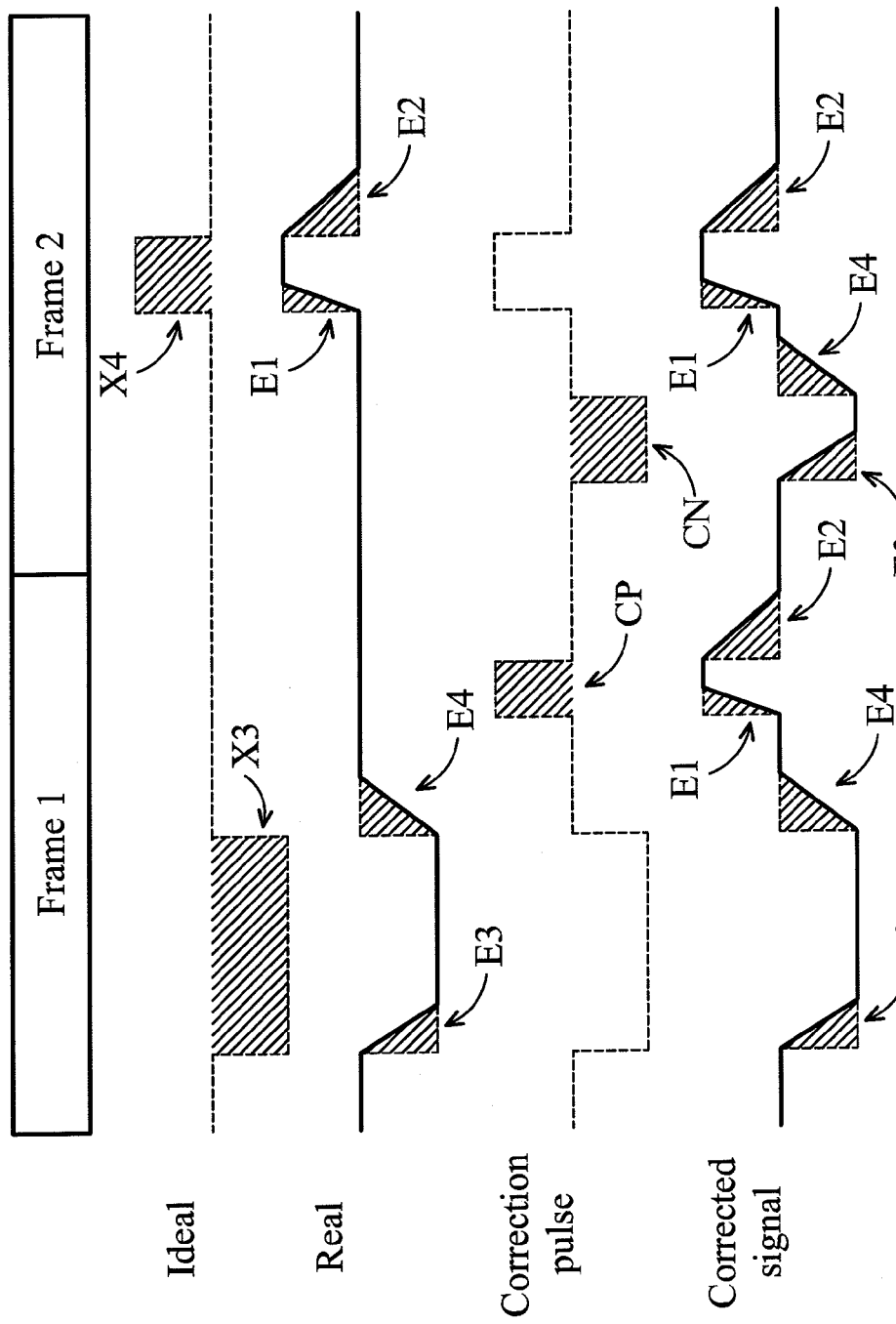

SWITCHING AMPLIFIER SYSTEM AND METHOD FOR SUPPRESSING SIGNAL DISTORTION THEREOF

CROSS REFERENCE TO RELATED APPLICATIONS

This application claims the benefit of U.S. Provisional Application No. 61/600,173, filed on Feb. 17, 2012, the entirety of which is incorporated by reference herein.

BACKGROUND OF THE INVENTION

1. Field of the Invention

The invention relates to switching amplifier systems, and more particularly to suppression of signal distortion of switching amplifier systems.

2. Description of the Related Art

A switching amplifier has higher power conversion efficiency than that of a class AB amplifier and therefore its use has become more and more popular. The switching amplifier, however, generates an output signal with rapid switching level and therefore induces significant electro magnetic interference (EMI). A switching amplifier converts an input signal into a ternary pulse width modulation (PWM) signal for driving an H-bridge of the switching amplifier. Referring to FIG. 1A, a schematic diagram of generation of a ternary PWM signal of a switching amplifier is shown. The ternary PWM signal has three output levels of +1, 0, and −1. When the amplitude of an input signal is greater than a threshold level, a PWM output signal with a +1 level and a pulse width in proportion to the amplitude of the input signal is generated. When the amplitude of the input signal is less than the threshold level, a PWM output signal with a −1 level and a pulse width in proportion to the amplitude of the input signal is generated.

When the switching amplifier converts an input signal into a PWM signal, signal distortion occurs and shaping errors are induced. Referring to FIG. 1B, a schematic diagram of shaping errors induced following generation of a PWM signal is shown. For example, an ideal waveform of a PWM signal is shown on an upper half of FIG. 1B. The ideal waveform comprises a pulse X1 in a first frame and a pulse X2 in a second frame. The pulse X1 has a level of +1, and the pulse X2 has a level of −1. When a switching amplifier performs a PWM conversion process, a real waveform is generated instead of the ideal waveform, as shown in the lower half of FIG. 1B. Due to a finite rising and falling speed of the real waveform, a shaping error E1 is induced to the real waveform of the pulse X1 when the value of the PWM signal changes from 0 to +1, and a shaping error E2 is induced to the real waveform of the pulse X1 when the value of the PWM signal changes from +1 to 0. Similarly, a shaping error E3 is induced to the real waveform of the pulse X2 when the value of the PWM signal changes from 0 to −1, and a shaping error E4 is induced to the real waveform of the pulse X2 when the value of the PWM signal changes from −1 to 0.

Thus, the area of the real waveform of a positive pulse X1 is equal to (X1−E1+E2), and the area of the real waveform of a negative pulse X2 is equal to (X2−E3+E4). When a PWM conversion process is performed, a total shaping error of (E2−E1) is therefore added to the positive pulse X1 of the PWM output signal, and a total shaping error of (E4−E3) is therefore added to the negative pulse X2 of the PWM output signal. A signal distortion is therefore generated on the PWM output signal according to whether the level of the input signal is positive or negative. Referring to FIG. 1C, a schematic diagram of a transfer curve of a PWM output signal is shown. A dotted line indicates a transfer curve between an input signal and an ideal PWM output signal. A solid line indicates a transfer curve between an input signal and a real PWM output signal. The difference between the solid line and the dotted line reflects the signal distortion based on a polarity of the input signal. The cross-over signal distortion generated in a PWM conversion process degrades performance of the switching amplifier. Thus, a method for avoiding the situation where signal distortion is induced by a PWM conversion process is therefore required to improve the performance of the switching amplifier.

Referring to FIG. 2, a block diagram of a closed-loop switching amplifier system 20 is shown. The switching amplifier system 20 comprises a digital signal processor 21, a noise shaper 22, a pulse width logic 23, an H-bridge 24 comprising power switches, and an analog-to-digital converter (ADC) 26. The digital signal processor 21 processes an input signal S21 to generate a signal S22. The noise shaper 22 performs a noise shaping process on the signal S22 according to a feedback signal S26 to generate a signal S23. The pulse width logic 23 converts the signal S23 from a PCM format to a PWM format to generate a signal S24. The H-bridge 24 amplifies the signal S24 to generate a signal S25 to drive the loudspeaker 25. The aforementioned cross-over signal distortion is induced by the power switches of the H-bridge 24. To suppress the signal distortion, the ADC 26 samples the signal S25 output by the power switch of the H-bridge 24 to obtain a signal S26, and the signal S26 is further fed back to the noise shaper as a feedback input. The switching amplifier system 20 therefore forms a closed loop and the signal distortion due to shape errors induced at the power switches of the H-bridge 24 is therefore suppressed. The ADC 26, however, occupies a large chip area and has a complex circuit structure. The hardware cost of the switching amplifier system 20 shown in FIG. 2 is therefore increased and the switching amplifier system is therefore rarely implemented.

BRIEF SUMMARY OF THE INVENTION

The invention provides a method for suppressing signal distortion of a switching amplifier system. In one embodiment, the switching amplifier system receives an input signal and generates a switched output signal. First, a corrected waveform is produced to generate a modulated output by modulating the input signal with an inverse-polarity correcting pulse waveform. The modulated output is then fed back to shape an error introduced by the inverse-polarity correcting pulse waveform.

The invention further provides a switching amplifier system. In one embodiment, the switching amplifier system comprises a noise shaper, a corrector, and a pulse width logic. The noise shaper receives a first signal, performs a noise shaping process to process the first signal according to a feedback signal to generate a second signal sliced into a plurality of frames. The corrector adds a plurality of correction pulses respectively to the frames of the second signal to obtain a third signal in such a way that the correction pulse added to the second signal in a target frame selected from the frames has a polarity inverse to that of an original waveform of the second signal in the target frame. The pulse width logic then converts the third signal from a pulse code modulation (PCM) format to a pulse width modulation (PWM) signal.

The invention provides a method for suppressing signal distortion of a switching amplifier system. In one embodiment, the switching amplifier system comprises a corrector and a pulse width logic. First, a first signal sliced into a plurality of frames is received by the corrector. A plurality of correction pulses are then respectively added to the frames of the first signal by the corrector to obtain a second signal in such a way that the correction pulse added to the first signal in a target frame selected from the frames has a polarity inverse to that of an original waveform of the first signal in the target frame. The third signal is then converted from a pulse code modulation (PCM) format to a pulse width modulation (PWM) signal by the pulse width logic.

The invention provides a switching amplifier system. In one embodiment, the switching amplifier system comprises a digital signal processor, a noise shaper, a corrector, a pulse width logic, and an H bridge. The digital signal processor processes an input signal to generate a first signal. The noise shaper performs a noise shaping process to process the first signal according to a feedback signal to generate a second signal sliced into a plurality of frames. The corrector adds a plurality of correction pulses respectively to the frames of the second signal to obtain a third signal in such a way that the correction pulse added to the second signal in a target frame selected from the frames has a polarity inverse to that of an original waveform of the second signal in the target frame. The pulse width logic converts the third signal from a pulse code modulation (PCM) format to a pulse width modulation (PWM) signal. The H-bridge amplifies the PWM signal to obtain a driving signal, and drives a loudspeaker according to the driving signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 1A is a schematic diagram of generation of a ternary PWM signal of a switching amplifier;

FIGS. 6A, 6B, and 6C are schematic diagrams of correction pulses added by the corrector of the switching amplifier system shown in FIG. 5A;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3A:
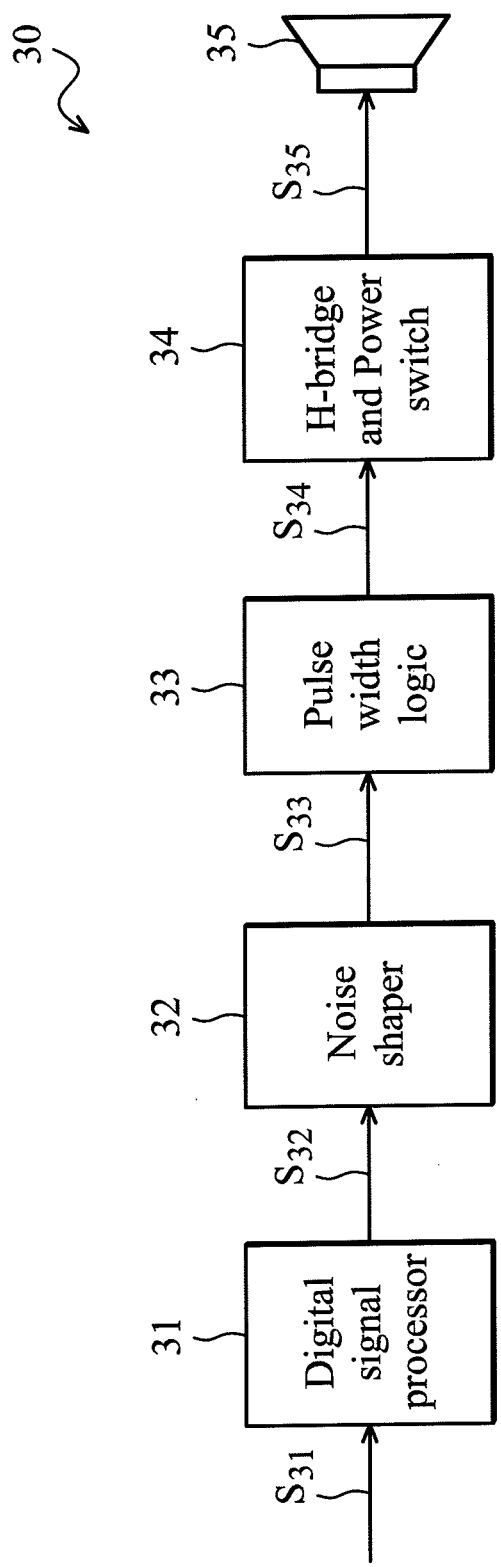
FIG. 3A is a block diagram of an open-loop switching amplifier.

Referring to FIG. 3A, a block diagram of an open-loop switching amplifier 30 is shown. The open-loop switching amplifier system 30 comprises a digital signal processor 31, a noise shaper 32, a pulse width logic 33, and an H-bridge 34 comprising power switches. The digital signal processor 31 processes an input signal S31 to generate a signal S32. The noise shaper 32 performs a noise shaping process on the signal S32 to generate a signal S33. The pulse width logic 33 converts the signal S33 from a PCM format to a PWM format to generate a signal S34. The H-bridge 34 amplifies the signal S34 to generate a signal S35 to drive a loudspeaker 35.

Figure 3B:
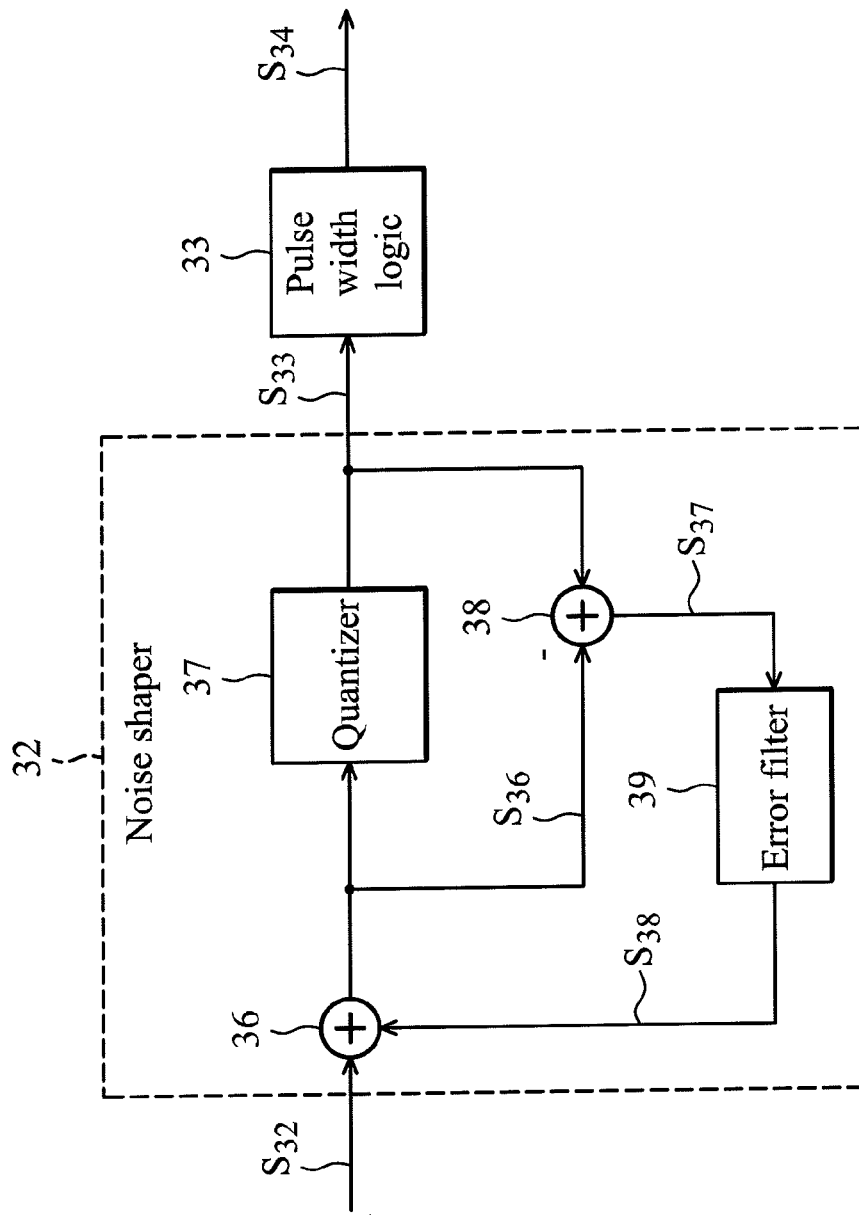
FIG. 3B is a detailed block diagram of a noise shaper of FIG. 3A.

Referring to FIG. 3B, a detailed block diagram of the noise shaper 32 of FIG. 3A is shown. In one embodiment, the noise shaper 32 comprises two summation circuits 36 and 38, a quantizer 37, and an error filter 39. The summation circuit 36 adds a filtered signal S38 generated by the error filter 39 to the signal S32 to obtain a signal S36. The quantizer 37 then reduces a word length of the signal S36 from 24 bits to 6~8 bits to obtain the signal S33. The summation circuit 38 then subtracts the signal S36 from the signal S38 to obtain a quantization error signal S37. The error filter 39 then filters the quantization error signal S37 to obtain the filtered quantization error signal S38 sent to the summation circuit 36. Because the quantization error S37 is randomly distributed, the noise shaper 32 therefore shapes the quantization noise and moves the energy of the quantization noise from a low frequency band to a high frequency band.

Figure 1B:
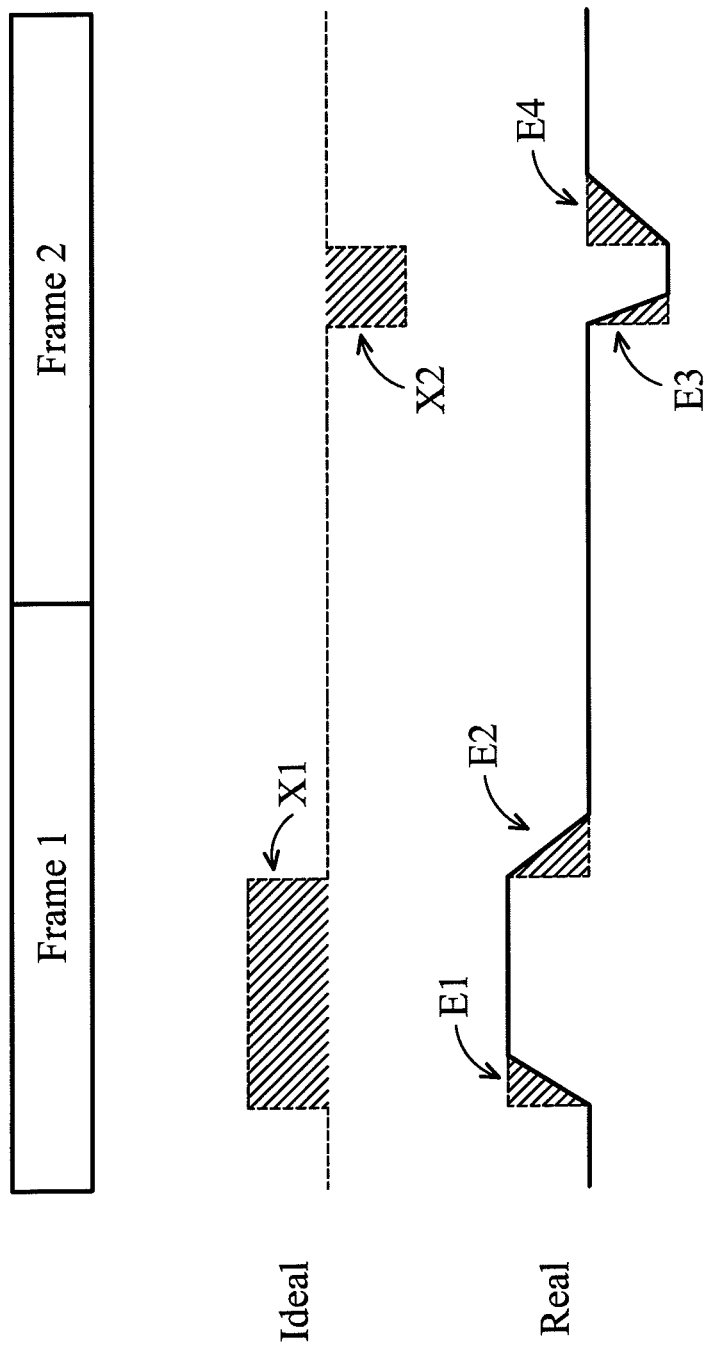
FIG. 1B is a schematic diagram of shaping errors induced in generation of a PWM signal.
Figure 1C:
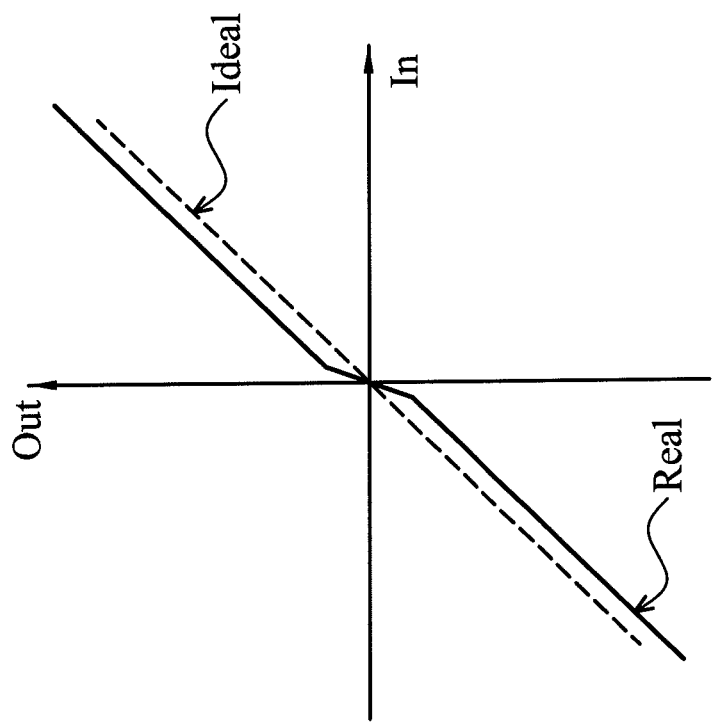
FIG. 1C is a schematic diagram of a transfer curve of a PWM output signal.
Figure 2:
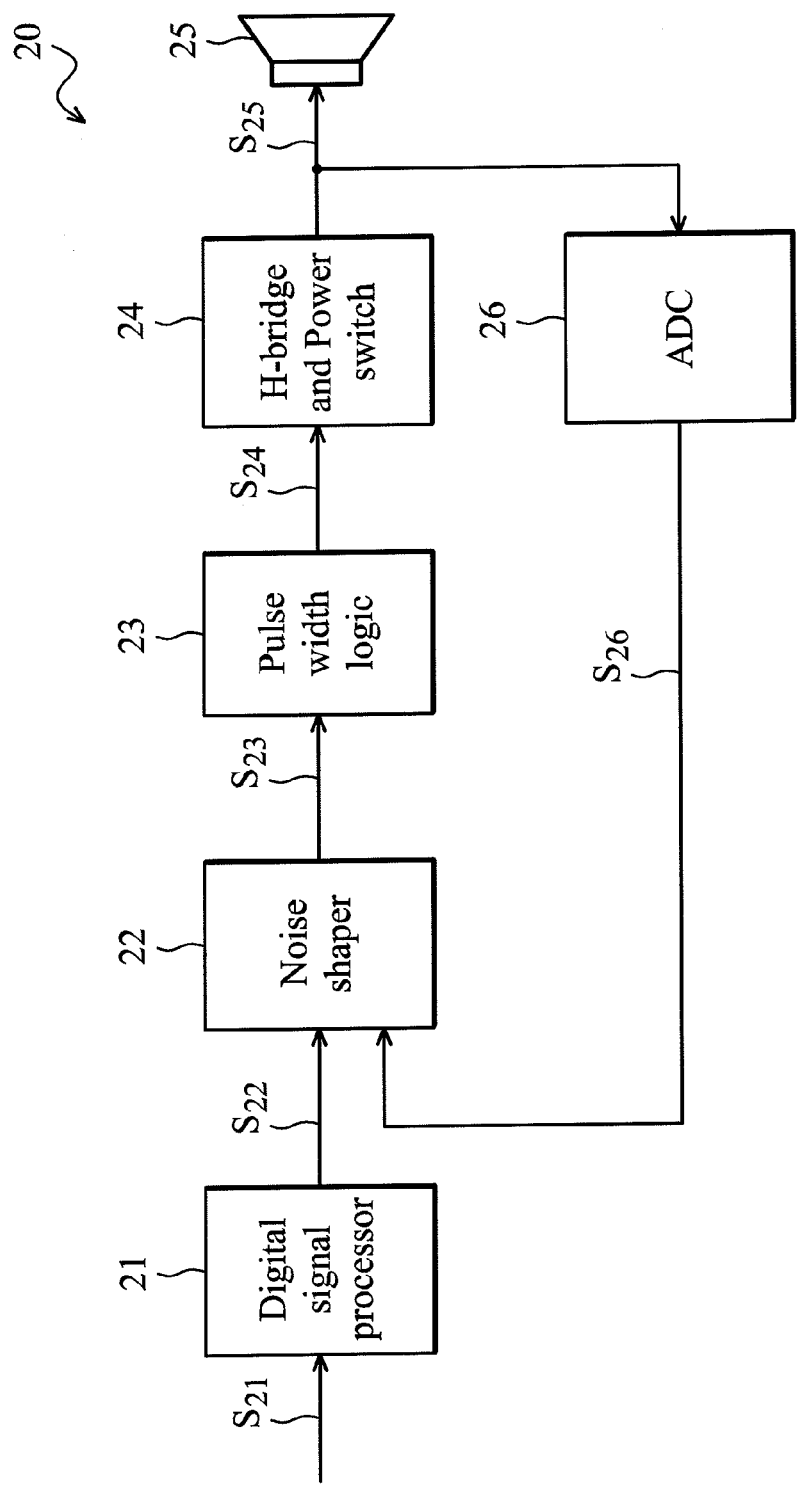
FIG. 2 is a block diagram of a closed-loop switching amplifier system.
Figure 4:
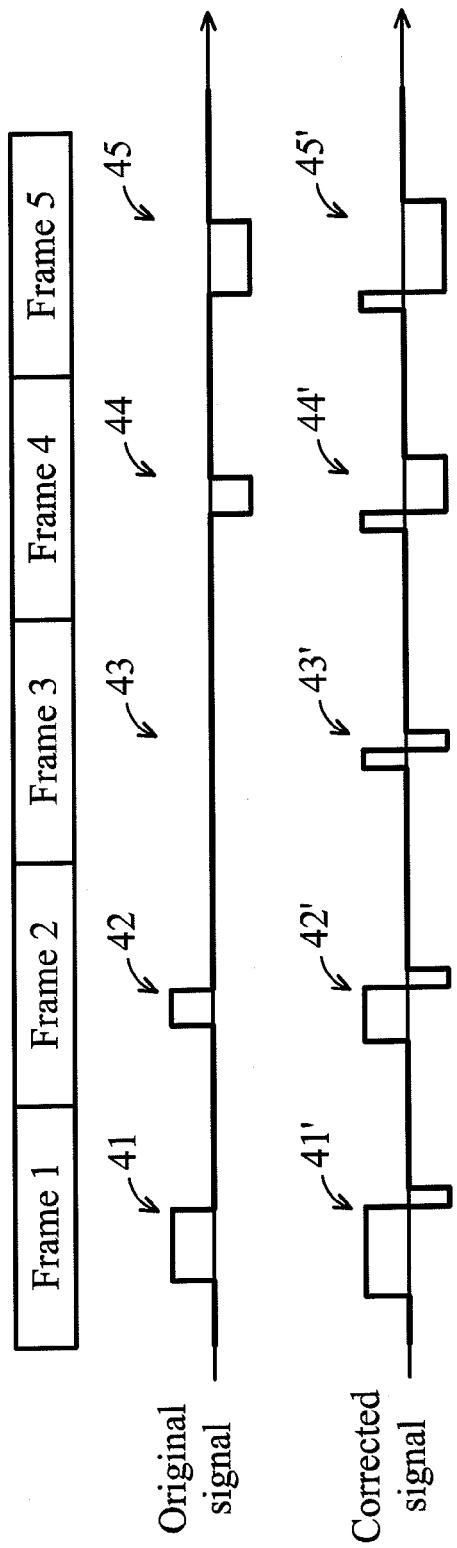
FIG. 4 is a schematic diagram of the addition of bi-state pulses according to the invention.

The switching amplifier system 30 shown in FIG. 3A, however, does not solve the aforementioned cross-over signal distortion induced by the power switches of the H-bridge 34, as shown in FIGS. 1B and 1C. Another embodiment of a switching amplifier system is therefore provided. Before a PWM conversion process is performed, the switching amplifier system divides an original signal into a plurality of frames and respectively adds a bi-state pulse to each of the frames of the original signal to obtain a corrected signal. Referring to FIG. 4, a schematic diagram of the addition of bi-state pulses according to the invention is shown. Assume that the original signal has five frames. The waveforms in the first frame and the second frame have a positive polarity, and the waveforms of the fourth frame and the fifth frame have a negative polarity. A bi-state pulse 43' which comprises both a positive pulse and a negative pulse is added to the waveforms 41~45 of all five frames of the original signal to obtain the waveforms 41'~45' of the corrected signal. When the switching amplifier system converts the corrected signal to a PWM signal, because the waveform in each of the frames of the corrected signal has both a positive polarity portion and a negative polarity portion, the shaping error induced by the PWM conversion process to each frame of the corrected signal is a constant equal to (−E1+E2−E3+E4). Thus, the cross-over signal distortion induced by the power switches of the H-bridge is mitigated.

Figure 5A:
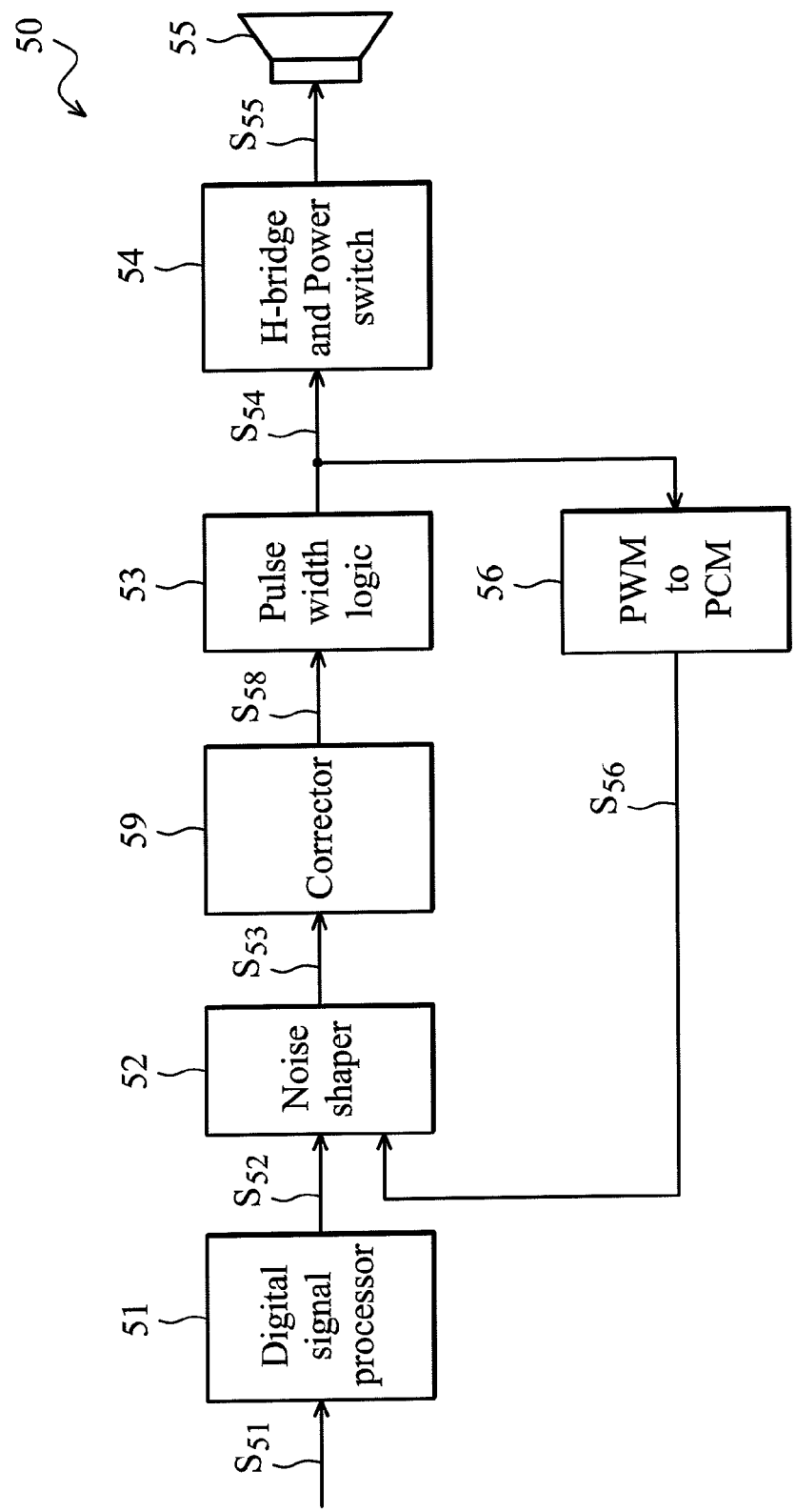
FIG. 5A is a block diagram of a switching amplifier system according to the invention.

The embodiment shown in FIG. 4, however, still has defects of a high noise floor and a high harmonic distortion. A new close-loop switching amplifier system is therefore provided to eliminate the cross-over signal distortion and lower the noise floor and harmonic distortion of an output signal. Referring to FIG. 5A, a block diagram of a switching amplifier system 50 according to the invention is shown. The switching amplifier system 50 comprises a digital signal processor 51, a noise shaper 52, a corrector 59, a pulse width logic 53, an H-bridge 54, and a PWM-to-PCM converter 56. The digital signal processor 51 processes an input signal S51 to generate a signal S52. The noise shaper 52 performs a noise shaping process on the signal S52 according to a feedback signal S56 to generate a signal S53. The corrector 59 slices the signal S53 into a plurality of frames and adds a plurality of correction pulses respectively to each of the frames of the signal S53 to obtain a corrected signal 58. The pulse width logic 53 then converts the signal S58 from a PCM format to a PWM format to generate a signal S54. The H-bridge 54 amplifies the signal S54 to generate a signal S55 to drive a loudspeaker 55. The PWM-to-PCM converter 56 converts the signal S54 generated by the pulse width logic 53 from the PWM format back to the PCM format to obtain the feedback signal S56.

Figure 5B:
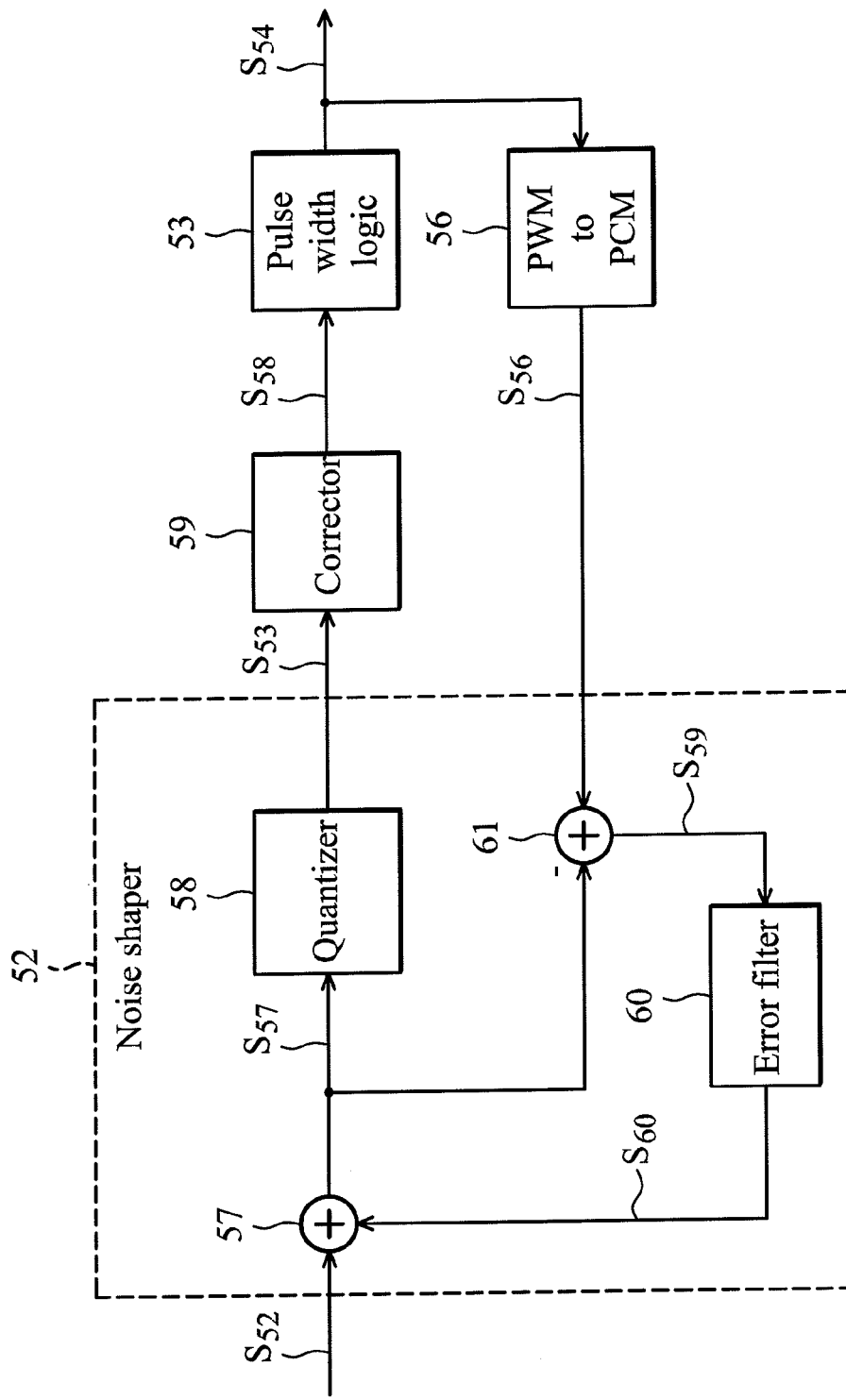
FIG. 5B is a detailed block diagram of a noise shaper of FIG. 5A.

Referring to FIG. 5B, a detailed block diagram of the noise shaper 52 of FIG. 5A is shown. In one embodiment, the noise shaper 52 comprises two summation circuits 57 and 61, a quantizer 58, and an error filter 60. The summation circuit 57 adds a filtered error signal S60 generated by the error filter 60 to the signal S52 to obtain a signal S57. The quantizer 58 then reduces a word length of the signal S57 from 24 bits to 6~8 bits to obtain the signal S53. The summation circuit 61 then subtracts the signal S59 from the signal S56 to obtain an error signal S59. The error filter 60 then filters the error signal S59 to obtain the filtered error signal S60 sent to the summation circuit 36.

Figure 6A:
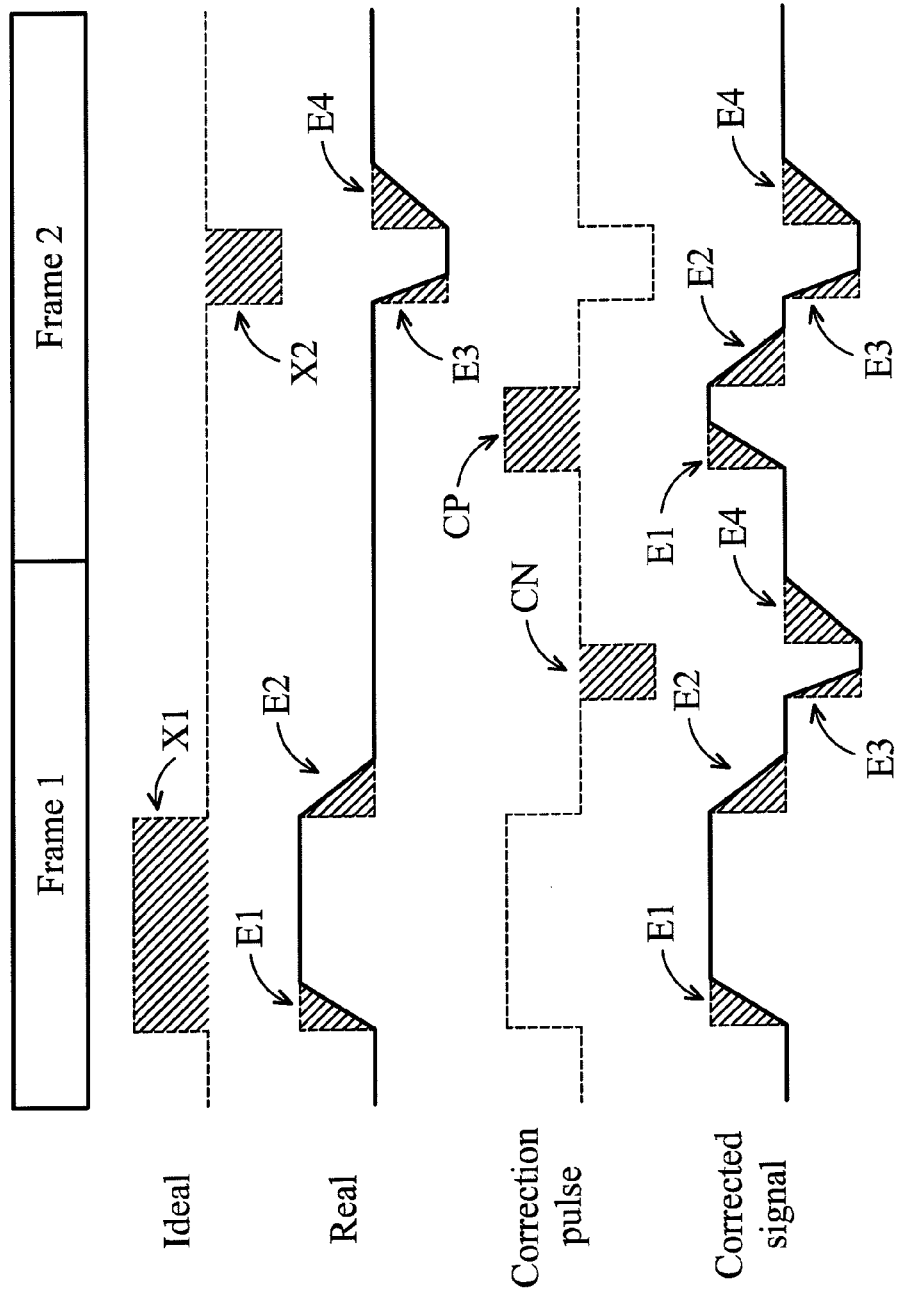

To avoid the situation of cross-over signal distortion, before the pulse width logic 53 performs a PWM conversion process, the corrector 59 of the switching amplifier system 50 divides the signal S53 into a plurality of frames and adds a plurality of correction pulses to each of the frames of the signal S53 to obtain the corrected signal S58. Referring to FIG. 6A, a schematic diagram of correction pulses added by the corrector 59 of the switching amplifier system 50 shown in FIG. 5A is shown. Assume that the original signal S53 has two frames. The waveform X1 in the first frame has a positive polarity, and the waveform X2 in the second frame has a negative polarity. The waveform X1 comprises shaping errors E1 and E2, and the waveform X2 comprises shaping errors E3 and E4. In one embodiment, when a target frame of the signal S53 is processed by the corrector 59, the corrector 59 generates a correction pulse with a polarity inverse to that of an original waveform in the target frame. For example, because the waveform X1 has a positive polarity, the corrector 59 generates a correction pulse CN with a negative polarity to be added to the waveform X1. Because the waveform X2 has a negative polarity, the corrector 59 generates a correction pulse CP with a positive polarity to be added to the waveform X2. The corrected signal S58 in the first frame therefore has an area equal to (X1−CN−E1+E2−E3+E4), and the total shaping error of the corrected signal S58 in the first frame is equal to (−E1+E2−E3+E4). The corrected signal S58 in the second frame has an area equal to (X2+CP−E1+E2−E3+E4), and the total shaping error of the corrected signal S58 in the second frame is also equal to (−E1+E2−E3+E4). The shaping error of the waveform in each frame of the corrected signal S58 is therefore kept at a constant and the cross-over signal distortion is therefore eliminated.

Figure 6C:
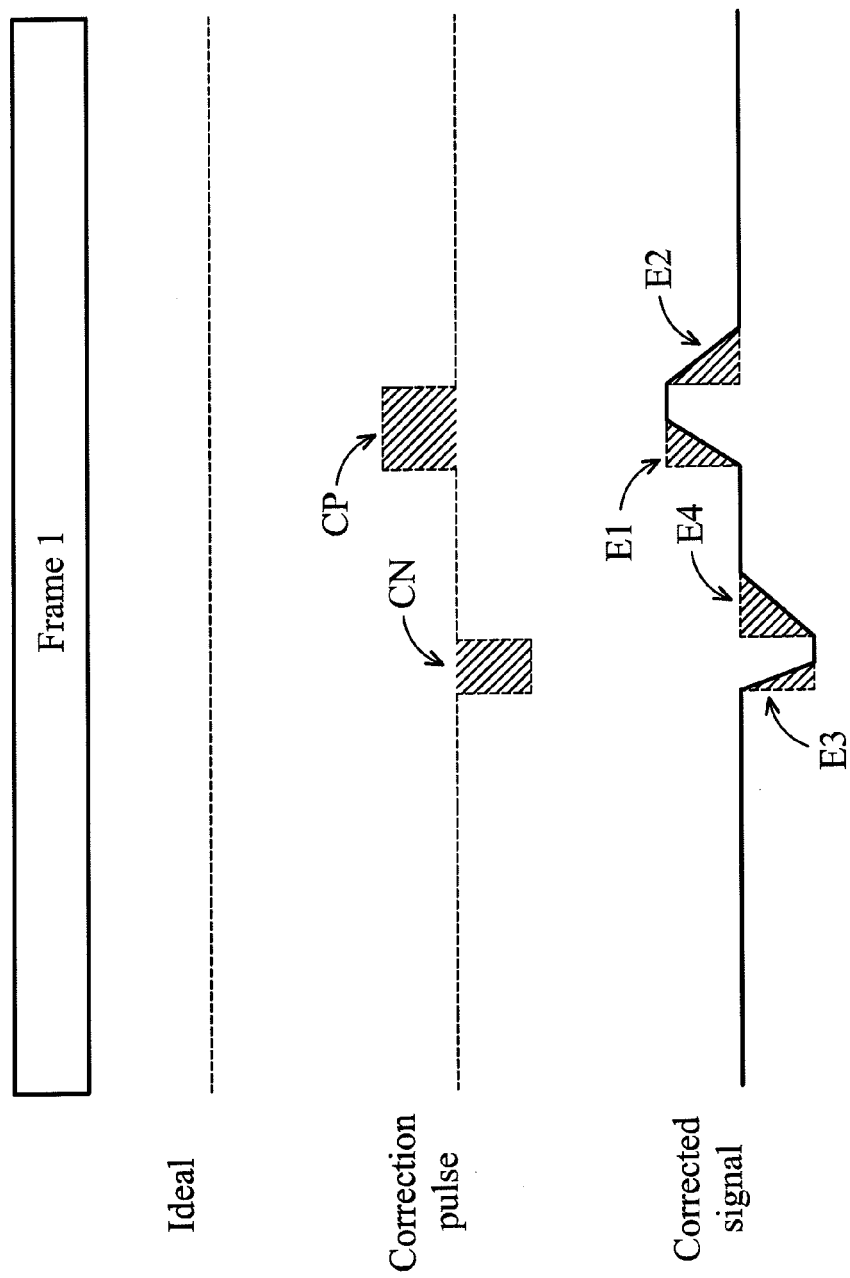

FIG. 6B shows two frames respectively comprising a negative waveform X3 and a positive waveform X4. A positive correction pulse CP is added to the negative waveform X3 and a negative correction pulse CN is added to the positive waveform X4. The negative waveform X3 and the positive waveform X4 also both have a total shaping error equal to (−E1+E2−E3+E4). FIG. 6C shows a frame comprising a zero waveform. The corrector 59 therefore adds a negative correction pulses CN and a positive correction pulse CP to the zero waveform. The zero waveform has a total shaping error equal to (−E1+E2−E3+E4).

Figure 7:
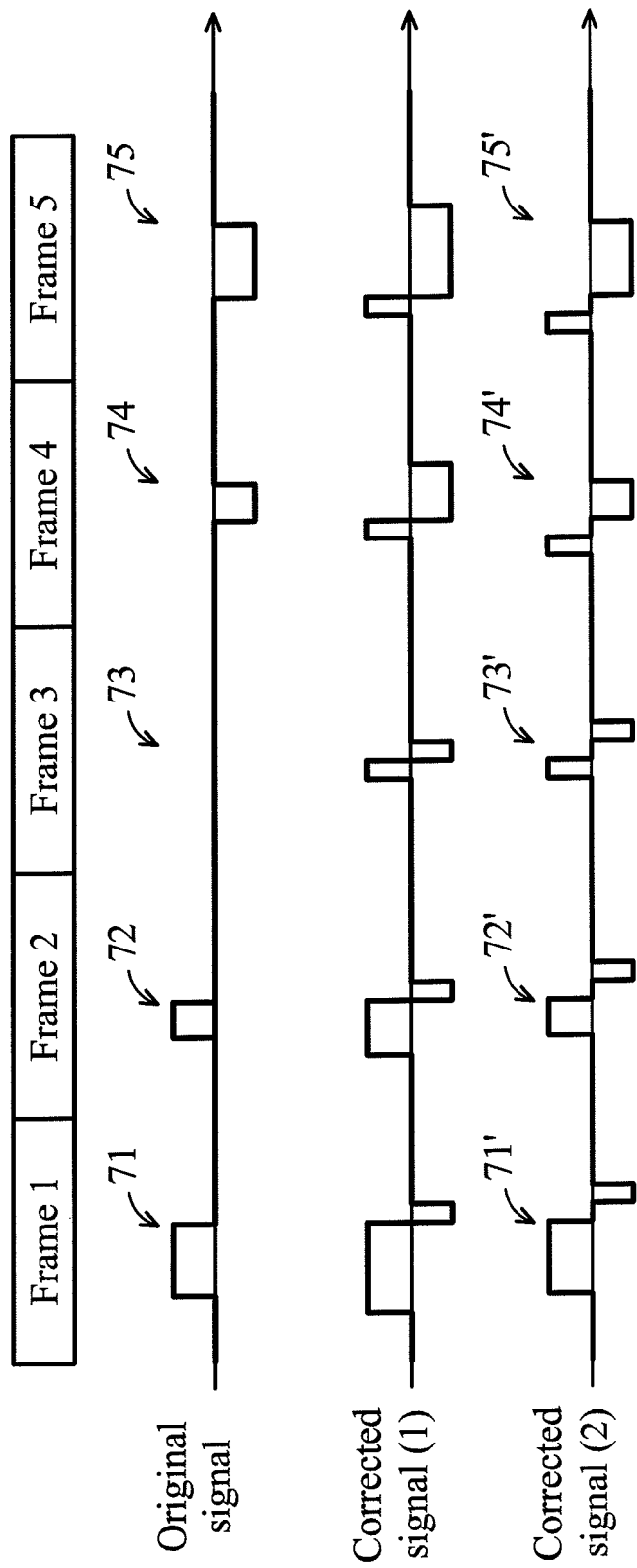
FIG. 7 is a schematic diagram of the addition of correction pulses according to the invention.

Referring to FIG. 7, a schematic diagram of the addition of correction pulses according to the invention is shown. Assume that the original signal S53 has five frames. The waveforms in the first frame and the second frame have a positive polarity, and the waveforms of the fourth frame and the fifth frame have a negative polarity. The corrector 59 therefore adds a negative correction pulse to the waveforms 71 and 72 of the original signal S53 to obtain the waveforms 71' and 72' of the corrected signal S58, adds a positive correction pulse to the waveforms 74 and 74 of the original signal S53 to obtain the waveforms 74' and 74' of the corrected signal S58, and adds a bi-state correction pulse to the zero waveform 73 of the original signal S53 to obtain the waveform 73 of the corrected signal S58. When the switching amplifier system 50 converts the corrected signal to a PWM signal S54, the shaping error induced by the PWM conversion process to each frame of the corrected signal S58 is a constant equal to (−E1+E2−E3+E4). Thus, the cross-over signal distortion induced by the power switches of the H-bridge 54 is mitigated.

Figure 8:
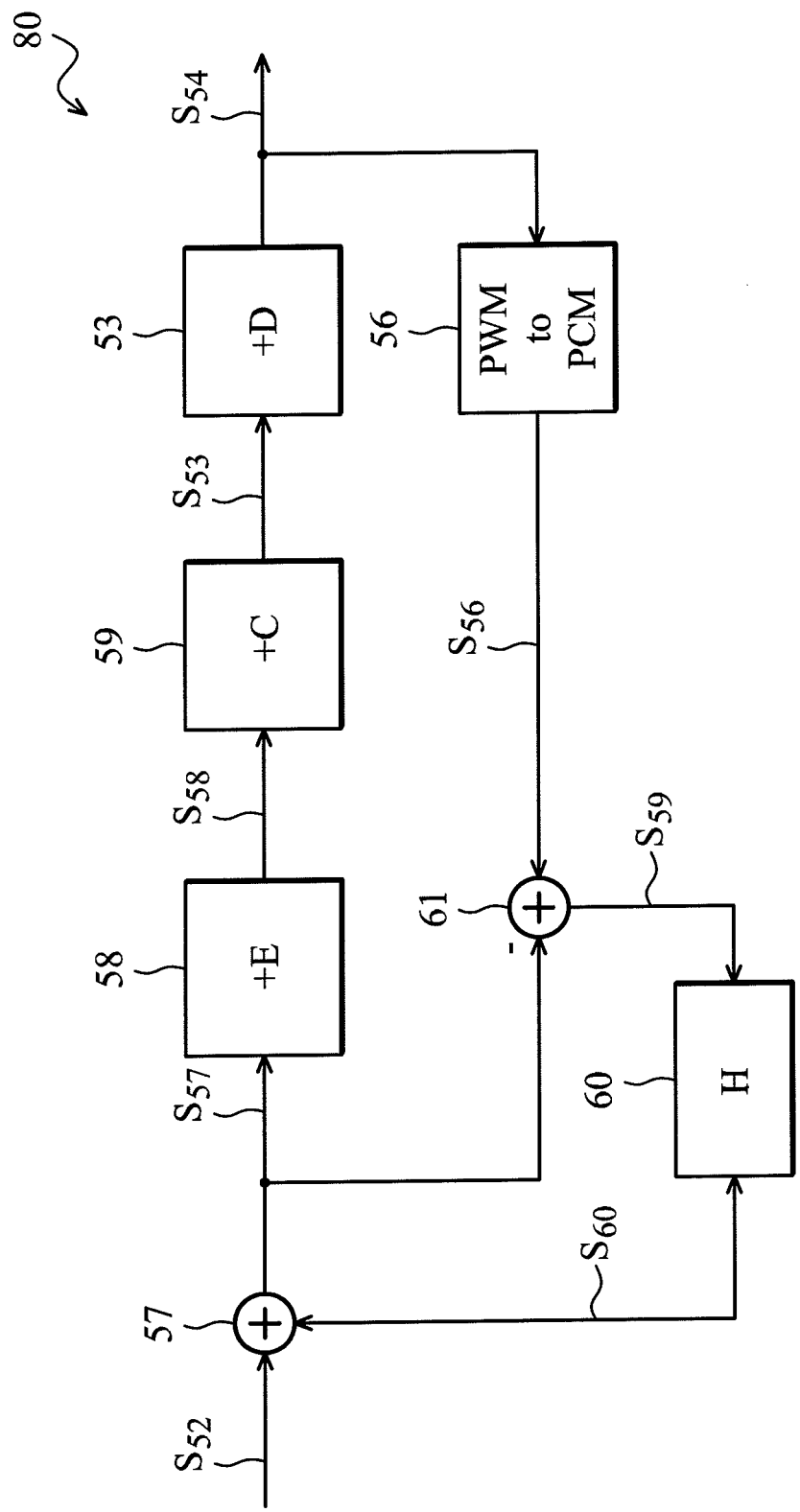
FIG. 8 is a schematic diagram of calculation of the transfer function of the error filter according to the invention.

When the corrector 59 adds a correction pulse to the signal S53, the area of the corrected signal S58 is changed due to the correction pulse. The output signal S54 of the pulse width logic 53 is therefore fed back to the noise shaper 52. Referring to FIG. 8, a schematic diagram of calculation of the transfer function of the error filter 60 according to the invention is shown. Assume that the quantizer 59 adds a quantization noise E to the signal S57 to obtain the signal S58, the corrector 59 adds a correction error C to the signal S58 to obtain the signal S53, the pulse width logic 53 adds signal distortion D to the signal S53 to obtain the signal S54, and the transfer function of the error filter 50 is H.

Thus, the output signal S54 of the pulse width logic 53 is obtained according to the following equation:

$$S54 = S57 + E + C + D; \quad (1)$$

The output signal S59 of the summation circuit 61 is obtained according to the following equation:

$$S59 = S56 - S57; \quad (2)$$

The output signal S57 of the summation circuit 57 is obtained according to the following equation:

$$S57 = S60 + S52; \quad (3)$$

The output signal S60 of the error filter 60 is obtained according to the following equation:

$$S60 = H \times S59; \quad (4)$$

When the equations (2) and (4) are combined with the equation (3), the following equation is obtained:

$$S57 = S60 + S52 = H \times S59 + S52 = H \times (S56 - S57) + S52;$$
$$\rightarrow S57 = (S52 + H \times S56)/(1+H) = (S52 + H \times S54)/(1+H); \quad (5)$$

When equation (5) is combined with equation (1), the following equation is obtained:

$$S54=S57+E+C+D=(S52+H\times S54)/(1+H)+E+C+D;$$
$$\rightarrow S54=S52+(1+H)\times(E+C+D); \quad (6)$$

Assume that the output signal S54 of the pulse width logic 53 is Y, the transfer functions of the quantizer 58, the corrector 59, and the pulse width logic 53 are determined according to the following equation:

$$\frac{\partial Y}{\partial E} = \frac{\partial Y}{\partial C} = \frac{\partial Y}{\partial D} = (1+H); \quad (7)$$

Figure 9A:
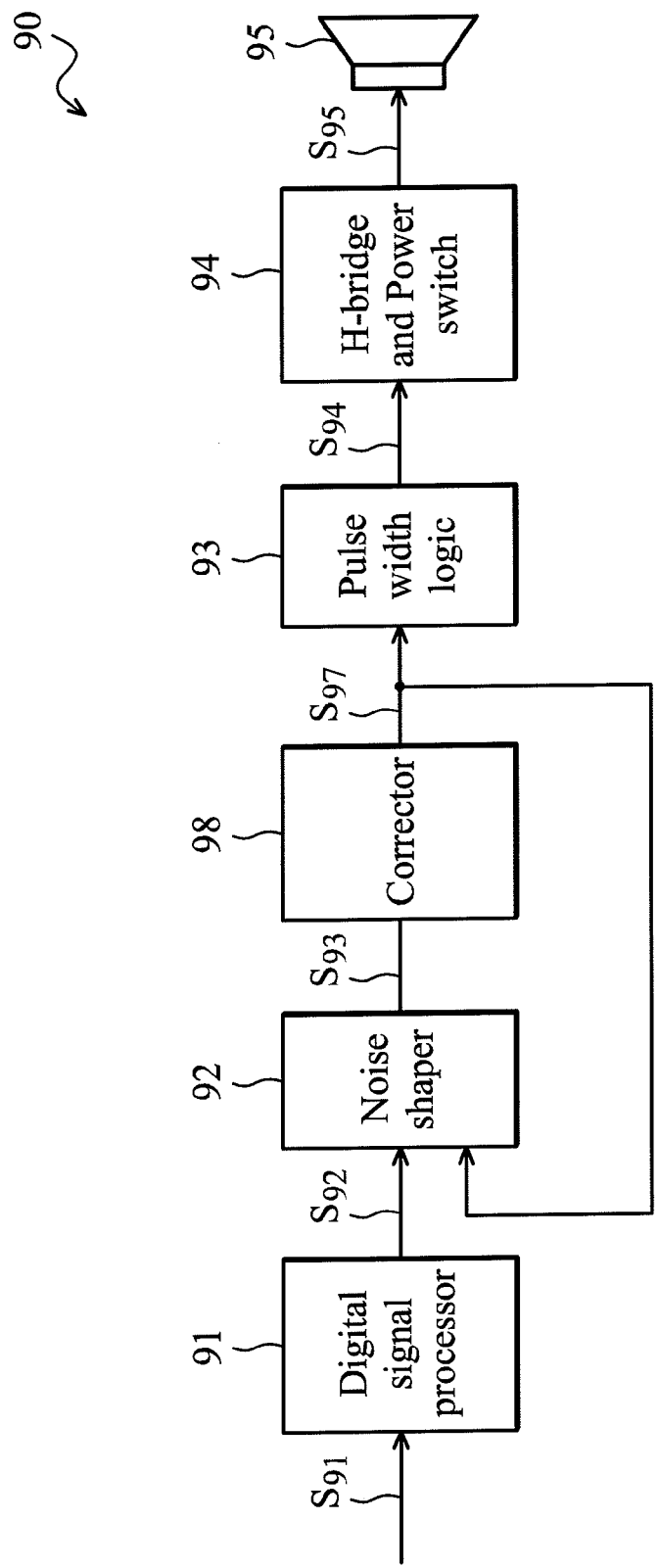
FIG. 9A is a block diagram of another embodiment of a switching amplifier system according to the invention.
Figure 9B:
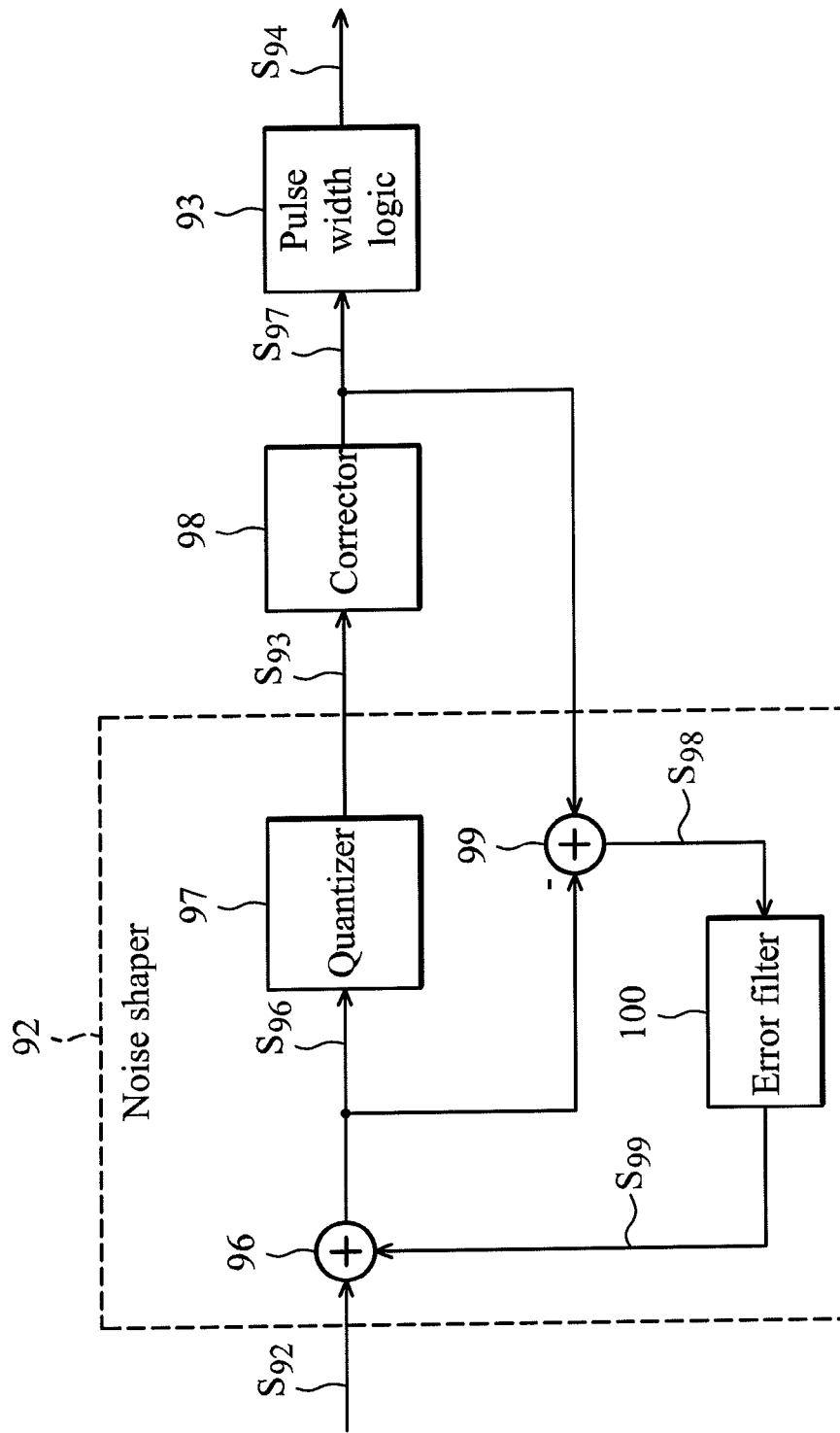
FIG. 9B is a detailed block diagram of the noise shaper of FIG. 9A.

Referring to FIG. 9A, a block diagram of another embodiment of a switching amplifier system 90 according to the invention is shown. The operation of the switching amplifier system 90 is almost the same as that of the switching amplifier system 50 shown in FIG. 5A, except that the feedback signal sent to the noise shaper 92 is the signal S97 output by the corrector 98. Referring to FIG. 9B, a detailed block diagram of the noise shaper 92 of FIG. 9A is shown. The noise shaper 92 similarly operates as the noise shaper 52 shown in FIG. 5B except that the summation circuit 99 of the noise shaper 92 receives the signal S97 output by the corrector 98 as an input.

Figure 10A:
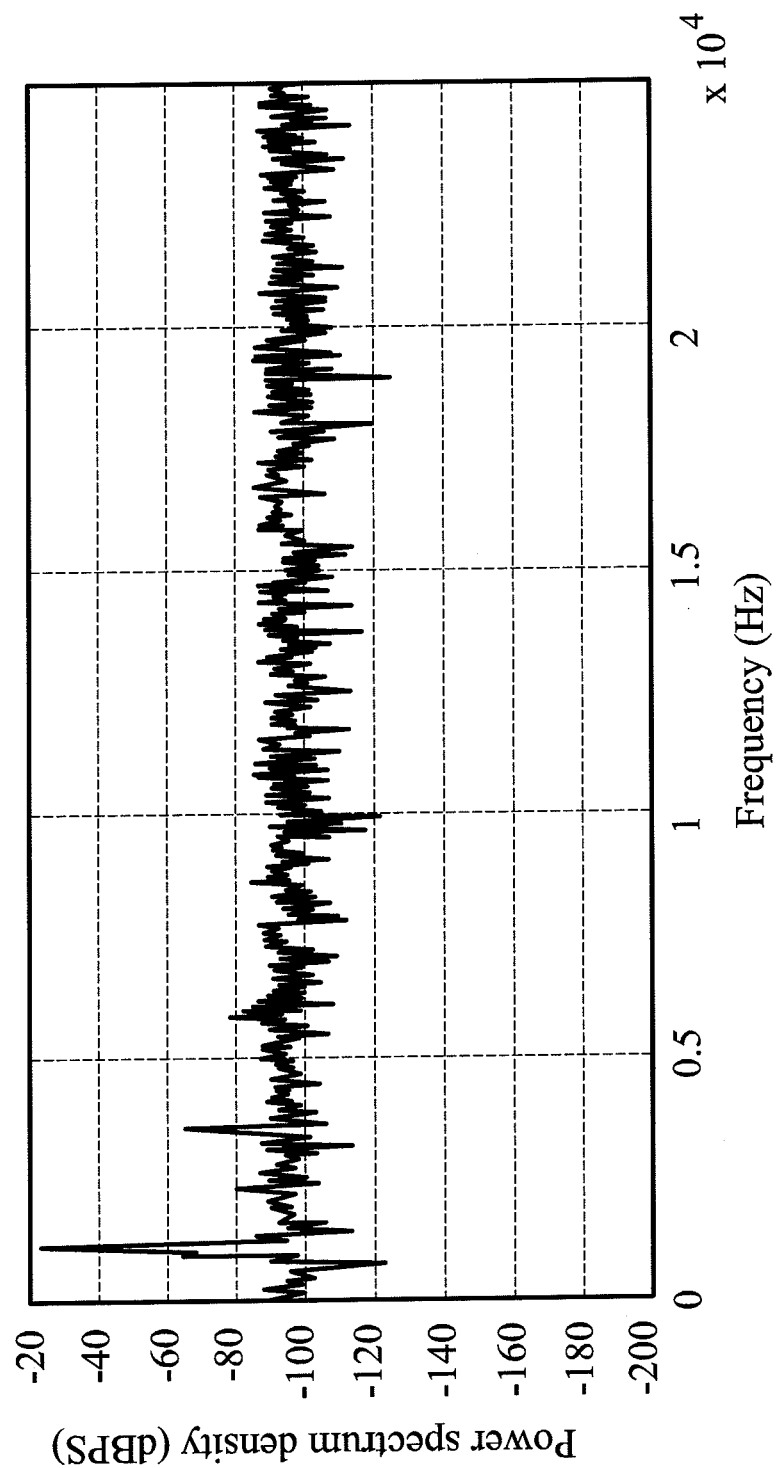
FIG. 10A is a power spectrum of an output signal generated by the switching amplifier system shown in FIG. 3A.
Figure 10B:
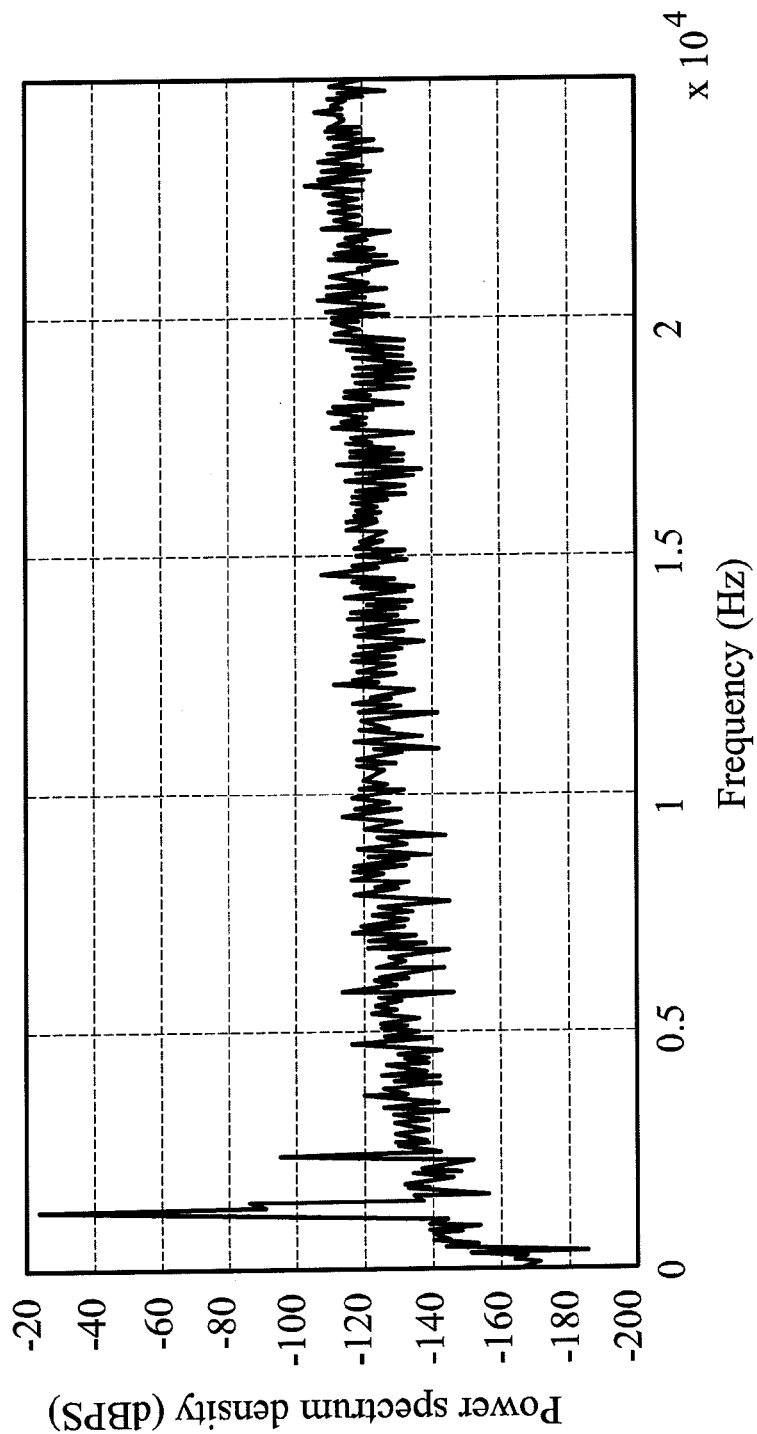
FIG. 10B is a power spectrum of an output signal generated by the switching amplifier system shown in FIG. 4.
Figure 10C:
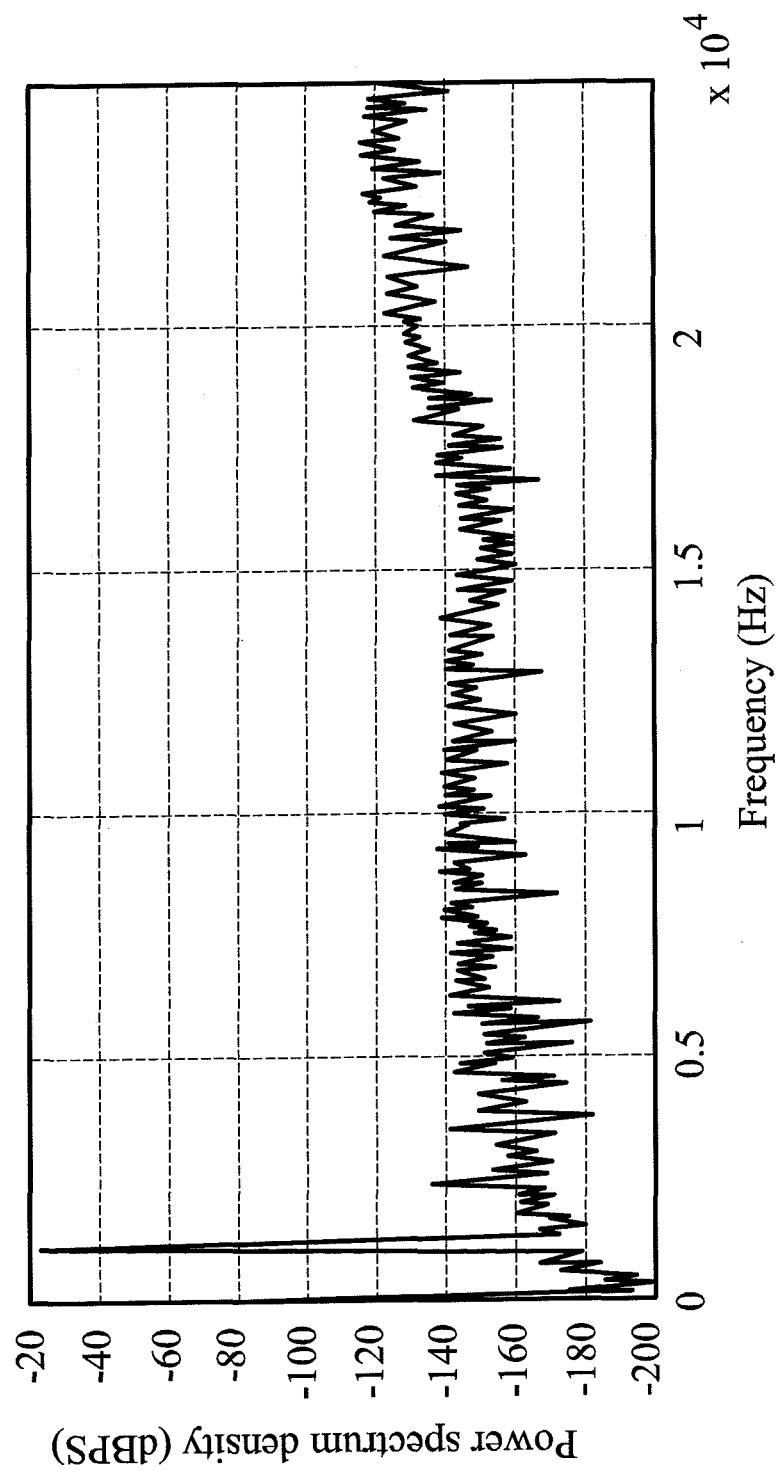
FIG. 10C is a power spectrum of an output signal generated by the switching amplifier system shown in FIG. 5A.

Referring to FIG. 10A, a power spectrum of an output signal S25 generated by the switching amplifier system 30 shown in FIG. 3A is shown. The input signal frequency is 1150 Hz and the amplitude is −24 dBFS. Harmonic peak power is about −65 dBFS (at 2300 Hz). Noise floor is high at the entire in-band (20~20 kHz), because the non-linear distortion due to shape error inter-modulates with quantization error. Referring to FIG. 10B, a power spectrum of an output signal generated by the switching amplifier system shown in FIG. 4 is shown. The harmonic peak power is lowered to −96 dBFS (at 2300 Hz). The noise floor is also reduced to about 25 dB. Referring to FIG. 10C, a power spectrum of an output signal generated by the switching amplifier system 50 shown in FIG. 5A is shown. The harmonic peak power is further lowered to −128 dBFS (at 2300 Hz). The noise floor is also improved to about 20 dB. In comparison with the switching amplifier systems shown in FIG. 3A and FIG. 4, the switching amplifier system 50 has the best performance.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A switching amplifier system, comprising:
a noise shaper, receiving a first signal, performing a noise shaping process to process the first signal according to a feedback signal to generate a second signal sliced into a plurality of frames;
a corrector, adding a plurality of correction pulses respectively to the frames of the second signal to obtain a third signal in such a way that the correction pulse added to the second signal in a target frame selected from the frames has a polarity inverse to that of an original waveform of the second signal in the target frame;
a pulse width logic, converting the third signal from a pulse code modulation (PCM) format to a pulse width modulation (PWM) signal; and
a PWM-to-PCM converter, converting the PWM signal to a fourth signal with the PCM format, and sending the fourth signal back to the noise shaper as the feedback signal.

2. The switching amplifier system as claimed in claim 1, wherein the corrector adds the correction pulse with a negative polarity to the second signal in the target frame when the original waveform of the second signal in the target frame has a positive polarity, and adds the correction pulse with a positive polarity to the second signal in the target frame when the original waveform of the second signal in the target frame has a negative polarity.

3. The switching amplifier system as claimed in claim 1, wherein the noise shaper comprises:
a first summation circuit, adding a filtered error signal to the first signal to obtain a fifth signal;
a quantizer, reducing a word length of the fifth signal to obtain the second signal;
a second summation circuit, subtracting the fifth signal from the feedback signal to obtain an error signal; and
an error filter, filtering the error signal to obtain the filtered error signal.

4. The switching amplifier system as claimed in claim 1, wherein the feedback signal is the third signal.

5. The switching amplifier system as claimed in claim 1, wherein the switching amplifier system further comprises:
a digital signal processor, processing an input signal to generate the first signal.

6. The switching amplifier system as claimed in claim 1, wherein the switching amplifier system further comprises:
an H bridge, coupled to a loudspeaker, amplifying the PWM signal to obtain a driving signal, and driving the loudspeaker according to the driving signal.

7. The switching amplifier system as claimed in claim 3, wherein the transfer functions of the quantizer, the corrector, and the pulse width logic are determined according to the following equation:

$$\frac{\partial Y}{\partial E} = \frac{\partial Y}{\partial C} = \frac{\partial Y}{\partial D} = (1+H);$$

wherein Y is the PWM signal, H is the transfer function of the error filter, E is quantization noise E added by the quantizer to the fifth signal, C is correction error added by the corrector to the second signal, and D is distortion added by the pulse width logic to the third signal.

8. A switching amplifier system, comprising:
a digital signal processor, processing an input signal to generate a first signal;
a noise shaper, performing a noise shaping process to process the first signal according to a feedback signal to generate a second signal sliced into a plurality of frames;
a corrector, adding a plurality of correction pulses respectively to the frames of the second signal to obtain a third signal in such a way that the correction pulse added to the second signal in a target frame selected from the frames has a polarity inverse to that of an original waveform of the second signal in the target frame;
a pulse width logic, converting the third signal from a pulse code modulation (PCM) format to a pulse width modulation (PWM) signal;
an H bridge, coupled to a loudspeaker, amplifying the PWM signal to obtain a driving signal, and driving the loudspeaker according to the driving signal; and, a PWM-to-PCM converter, converting the PWM signal to a fourth signal with the PCM format, and sending the fourth signal back to the noise shaper as the feedback signal.

9. The switching amplifier system as claimed in claim 8, wherein the corrector adds the correction pulse with a negative polarity to the second signal in the target frame when the original waveform of the second signal in the target frame has a positive polarity, and adds the correction pulse with a positive polarity to the second signal in the target frame when the original waveform of the second signal in the target frame has a negative polarity.

10. The switching amplifier system as claimed in claim 8, wherein the noise shaper comprises:
   a first summation circuit, adding a filtered error signal to the first signal to obtain a fifth signal;
   a quantizer, reducing a word length of the fifth signal to obtain the second signal;
   a second summation circuit, subtracting the fifth signal from the feedback signal to obtain an error signal; and
   an error filter, filtering the error signal to obtain the filtered error signal.

11. The switching amplifier system as claimed in claim 8, wherein the feedback signal is the third signal.

12. The switching amplifier system as claimed in claim 10, wherein the transfer functions of the quantizer, the corrector, and the pulse width logic are determined according to the following equation:

$$\frac{\partial Y}{\partial E} = \frac{\partial Y}{\partial C} = \frac{\partial Y}{\partial D} = (1+H);$$

wherein Y is the PWM signal, H is the transfer function of the error filter, E is quantization noise E added by the quantizer to the fifth signal, C is correction error added by the corrector to the second signal, and D is distortion added by the pulse width logic to the third signal.

* * * * *